(12) United States Patent
Park et al.

(10) Patent No.: US 7,223,689 B2
(45) Date of Patent: May 29, 2007

(54) METHODS FOR FORMING A METAL CONTACT IN A SEMICONDUCTOR DEVICE IN WHICH AN OHMIC LAYER IS FORMED WHILE FORMING A BARRIER METAL LAYER

(75) Inventors: Hee-sook Park, Seoul (KR); Gil-heyun Choi, Yongin (KR); Sang-bum Kang, Seoul (KR); Seong-geon Park, Yongin (KR); Kwang-jin Moon, Yongin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/112,356

(22) Filed: Apr. 22, 2005

(65) Prior Publication Data
US 2005/0186784 A1    Aug. 25, 2005

Related U.S. Application Data

(62) Division of application No. 10/615,362, filed on Jul. 8, 2003, now abandoned.

(30) Foreign Application Priority Data
Aug. 23, 2002    (KR) .............................. 2002-50072

(51) Int. Cl.
*H01L 21/4763*    (2006.01)

(52) U.S. Cl. .................... 438/629; 438/630; 438/648; 438/651; 257/E21.593

(58) Field of Classification Search ......... 438/626–686
See application file for complete search history.

(56) References Cited

U.S. PATENT DOCUMENTS

| 5,700,722 | A | 12/1997 | Sumi ........................... 438/649 |
| 5,998,873 | A | 12/1999 | Blair et al. .................. 257/766 |
| 6,091,148 | A | 7/2000 | Givens et al. ............... 257/750 |
| 6,271,122 | B1 | 8/2001 | Wieczorek et al. ......... 438/627 |
| 6,297,555 | B1 | 10/2001 | Zhao et al. .................. 257/758 |
| 2002/0019119 | A1* | 2/2002 | Saigal et al. ................. 438/581 |
| 2002/0093097 | A1 | 7/2002 | Kamoshima et al. ....... 257/751 |
| 2002/0119653 | A1* | 8/2002 | Yamane ....................... 438/637 |
| 2001/0107133 | | 6/2003 | Kazuo ......................... 438/629 |
| 2003/0107133 | A1 | 6/2003 | Tomita ........................ 257/758 |

* cited by examiner

*Primary Examiner*—H. Jey Tsai
(74) *Attorney, Agent, or Firm*—Myers Bigel Sibley & Sajovec, PA

(57) ABSTRACT

A metal contact in a semiconductor device is formed by forming an insulating layer having a contact hole therein on a silicon substrate. A cobalt layer is formed on a bottom and inner walls of the contact hole. A cobalt silicide layer is formed at the bottom of the contact hole while forming a titanium layer on the cobalt layer. A plug is formed on the titanium layer so as to fill the contact hole.

14 Claims, 11 Drawing Sheets

METHODS FOR FORMING A METAL CONTACT IN A SEMICONDUCTOR DEVICE IN WHICH AN OHMIC LAYER IS FORMED WHILE FORMING A BARRIER METAL LAYER

RELATED APPLICATIONS

This application is a divisional application of prior application Ser. No. 10/615,362, filed Jul. 8, 2003 now abandoned, which claims the benefit of and priority to Korean Patent Application No. 2002-50072, filed Aug. 23, 2002, the disclosures of which are hereby incorporated herein by reference.

FIELD OF THE INVENTION

The present invention relates to methods of manufacturing semiconductor devices, and, more particularly, to methods of forming metal contacts in semiconductor devices.

BACKGROUND OF THE INVENTION

As semiconductor devices have become more highly integrated, the design rules for semiconductor devices have been gradually reduced. Accordingly, the areas associated with a contact, which connects individual devices to circuit interconnect wiring in the semiconductor device, and a via contact, which connects an upper interconnect wiring to a lower interconnect wiring, have generally been reduced. In addition, contact depth is generally increasing due to a multi-layered semiconductor device structure.

Consequently, because the resistance of contacts is generally increasing, which may degrade semiconductor device characteristics, technology for reducing contact resistance may be desirable. With contact surface area decreasing and depth increasing, achieving adequate step coverage may be difficult. In other words, the depth of the contact is increased while reducing the area of the contact to increase an aspect ratio so that a process of filling metal in a contact hole without a void or disconnection may be difficult.

FIGS. 1A and 1B are sectional views illustrating a conventional method for forming a metal contact in a semiconductor device. Referring to FIG. 1A, an insulating layer 15 having a contact hole 13 is formed on a silicon substrate 11. A titanium layer 17 and a titanium nitride layer 19 are sequentially formed in the contact hole 13 and on the insulating layer 15 to form a barrier metal layer 21. The titanium layer 17 operates as an ohmic layer and the titanium nitride layer 19 operates as a diffusion barrier layer for preventing the diffusion of a tungsten layer 25 (refer to FIG. 1B), which will be formed in a subsequent process, into the silicon substrate 11. The titanium nitride layer 19 may also improve the surface adhesion of the tungsten, which will be formed in a subsequent process. A thermal process, such as a rapid thermal processing (RTP) or a rapid thermal annealing (RTA), is performed on the silicon substrate 11 having the barrier metal layer 21 so that a titanium silicate 23 layer is formed.

Referring to FIG. 1B, a tungsten layer 25 is formed on the barrier metal layer 21 in order to fill the contact hole 13. The tungsten layer 25 may be formed by chemical vapor deposition (CVD), which has generally effective gap filling characteristics. Because the tungsten layer 25 is formed using CVD, the contact hole 13 is generally efficiently filled with the tungsten layer 25.

Because the titanium silicate 23 layer of FIGS. 1A and 1B has a relatively high level of contact resistance in a highly integrated semiconductor device, however, another material may be substituted for the titanium silicate layer 23. Accordingly, a method for forming a metal contact in a semiconductor device using cobalt silicate will now be discussed.

FIGS. 2A through 2F are sectional views illustrating a conventional method for forming a metal contact in a semiconductor device using cobalt silicide. Referring to FIG. 2A, an insulating layer 33 having a contact hole 32 is formed on a silicon substrate 31. A cobalt layer 35 is formed in the contact hole 32 and on the insulating layer 33 by physical vapor deposition (PVD). In addition, a titanium nitride layer 37 is formed on the cobalt layer 35.

Referring now to FIG. 2B, a first thermal process, such as RTP or RTA, is performed on the silicon substrate 31 on which the cobalt layer 35 and the titanium nitride layer 37 are formed to silicidate the silicon substrate 31 and to form a $CoSi_x$ layer 39 on the bottom of the contact hole 32.

Referring now to FIG. 2C, the silicon substrate 31, on which the $CoSi_x$ layer 39 is formed, is dipped in a sulfuric acid solution to strip the cobalt layer 35 and the titanium nitride layer 37 from the contact hole 32 and the insulating layer 33. As a result, the $CoSi_x$ layer 39 remains on the bottom of the contact hole 32. Because the $CoSi_x$ layer 39 has a relatively high resistance, the $CoSi_x$ layer 39 may be transformed into a $CoSi_2$ type cobalt silicide layer by performing a subsequent thermal process.

Referring now to FIG. 2D, a second thermal process, such as RTP or RTA, is performed on the silicon substrate 31 on which the $CoSi_x$ layer 39 is formed to silicidate the silicon substrate 31 and to form a cobalt silicide 41 layer on the bottom of the contact hole 32. Thereafter, the silicon substrate 31 having the cobalt silicide 41 layer formed thereon is cleaned. Referring now to FIG. 2E, a titanium layer 43 and a titanium nitride layer 45 are sequentially formed on the top surface of the silicon substrate 31 having the cobalt silicide 41 layer to form a barrier metal layer 47.

Referring now to FIG. 2F, a tungsten layer 49 for filling the contact hole 32 is formed on the barrier metal layer 47. The tungsten layer 49 is formed using CVD, which has generally effective gap filling characteristics. Because the tungsten layer 49 is formed using CVD, the contact hole 32 is generally efficiently filled with the tungsten layer 49.

According to the method described with respect to FIGS. 2A through 2F, because the cobalt silicide layer 41 has a generally lower reactivity to dopant than titanium silicide, the cobalt silicide layer 41 can attain a lower contact resistance. Unfortunately, forming a metal contact in accordance with the method of FIGS. 2A through 2F involves performing thermal processes twice and a strip process. In addition, the cobalt layer 35 is formed using PVD according to the method described with respect to FIGS. 2A through 2F, which generally provides poorer step coverage. Accordingly, the thickness of the cobalt layer 35 is typically increased to obtain a cobalt silicide layer 41 having a proper thickness on the contact bottom. When such a thick cobalt layer 35 is deposited, a strip process for removing the cobalt layer 35, which remains after a silicidation process, may be necessary. Furthermore, a reinforced cleaning process is typically performed after the strip processes.

SUMMARY OF THE INVENTION

According to some embodiments of the present invention, a metal contact in a semiconductor device is formed by forming an insulating layer having a contact hole therein on a silicon substrate. A cobalt layer is formed on a bottom and inner walls of the contact hole. A cobalt silicide layer is formed at the bottom of the contact hole while forming a titanium layer on the cobalt layer. A plug is formed on the titanium layer so as to fill the contact hole.

In other embodiments, the plug comprises titanium nitride.

In still other embodiments, a titanium nitride layer is formed on the titanium layer and the plug is formed on the titanium nitride layer so as to fill the contact hole.

In still other embodiments, the titanium nitride layer has a thickness of about 50 to 500 Å and is formed using chemical vapor deposition (CVD) at a temperature of about 400 to 750° C.

In still other embodiments, the plug comprises at least one of tungsten, titanium nitride, aluminum, and tantalum nitride.

In still other embodiments, the cobalt layer, the titanium layer, and the titanium nitride layer are formed in situ without a vacuum break.

In still other embodiments, the cobalt layer has a thickness of about 5 to 200 Å and is formed using one of physical vapor deposition (PVD) and chemical vapor deposition (CVD).

In still other embodiments, the cobalt layer is formed using PVD at a temperature of about 25 to 500° C.

In still other embodiments, the titanium layer has a thickness of about 5 to 150 Å and is formed using chemical vapor deposition (CVD) at a temperature of about 400 to 750° C.

In still other embodiments, the substrate and insulating layer are cleaned after forming the insulating layer.

In further embodiments of the present invention, a metal contact in a semiconductor device is formed by forming an insulating layer having a contact hole therein on a silicon substrate. A cobalt layer is formed on a bottom and inner walls of the contact hole. A cobalt silicide layer is formed at the bottom of the contact hole while forming a titanium nitride layer on the cobalt layer. A plug is formed on the titanium nitride layer so as to fill the contact hole.

In still further embodiments of the present invention, a metal contact in a semiconductor device is formed by forming an insulating layer having a contact hole therein on a silicon substrate. A cobalt layer is formed on a bottom and inner walls of the contact hole. A cobalt silicide layer is formed at the bottom of the contact hole while forming a plug that fills the contact hole on the cobalt layer.

In still further embodiments of the present invention, a metal contact in a semiconductor device is formed by forming an insulating layer having a contact hole therein on a silicon substrate. A titanium layer is formed on a bottom and inner walls of the contact hole. A cobalt layer is formed on the titanium layer. A complex silicide layer is comprising titanium silicide and cobalt silicide is formed at the bottom of the contact hole while forming a titanium nitride layer on the cobalt layer. A plug is formed on the titanium nitride layer so as to fill the contact hole.

In still further embodiments of the present invention, a metal contact in a semiconductor device is formed by forming an insulating layer having a contact hole therein on a silicon substrate. A titanium layer is formed on a bottom and inner walls of the contact hole. A cobalt layer is formed on the titanium layer. A complex silicide layer comprising titanium silicide and cobalt silicide is formed at the bottom of the contact hole while forming a plug that fills the contact hole on the cobalt layer.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1A:
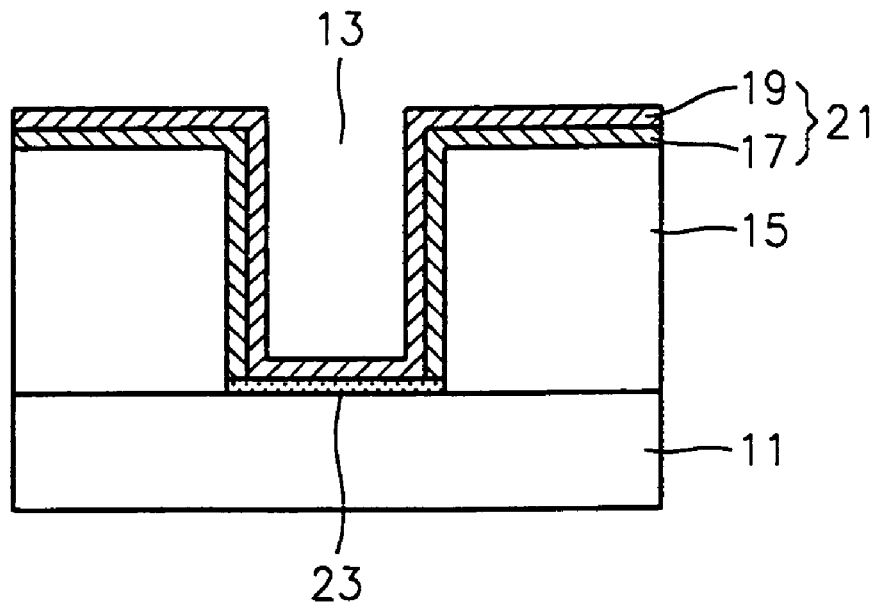
FIGS. 1A and 1B are sectional views illustrating a conventional method for forming a metal contact in a semiconductor device.
Figure 1B:
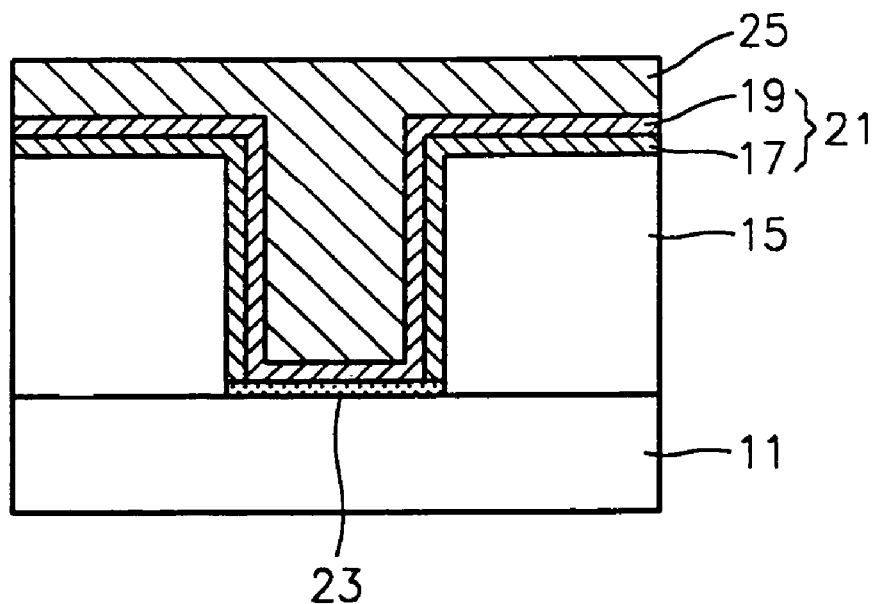
Figure 2A:
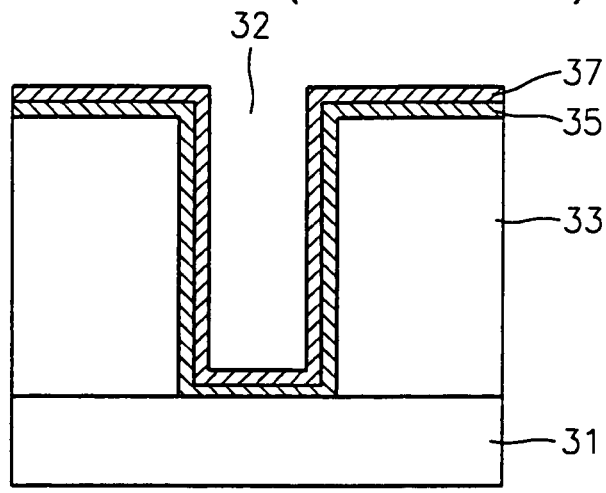
FIGS. 2A through 2F are sectional views illustrating a conventional method for forming a metal contact in a semiconductor device using cobalt silicide.
Figure 2B:
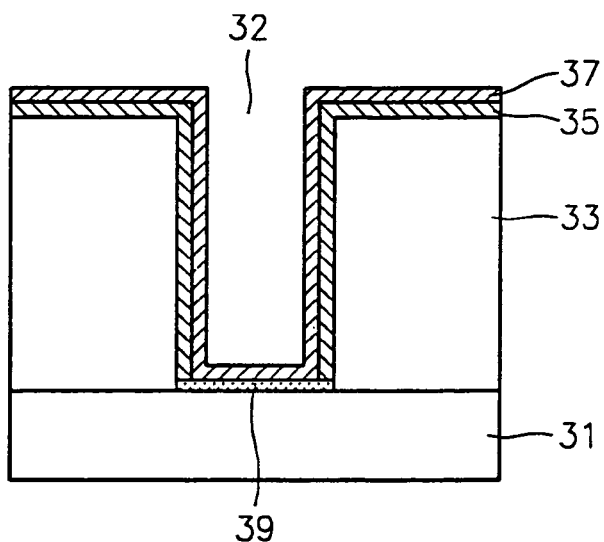
Figure 2C:
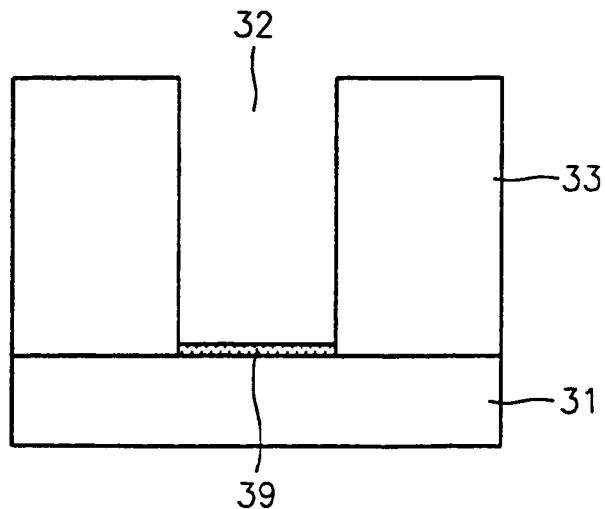
Figure 2D:
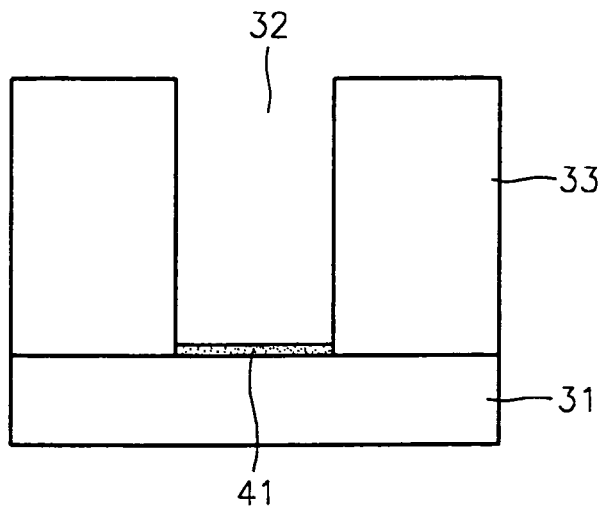
Figure 2E:
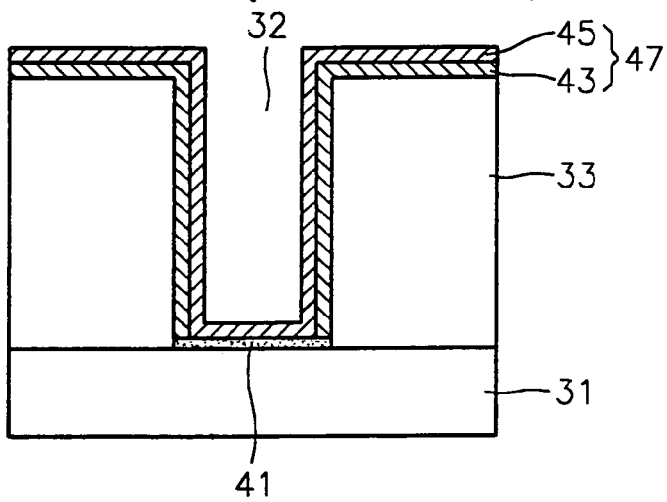
Figure 2F:
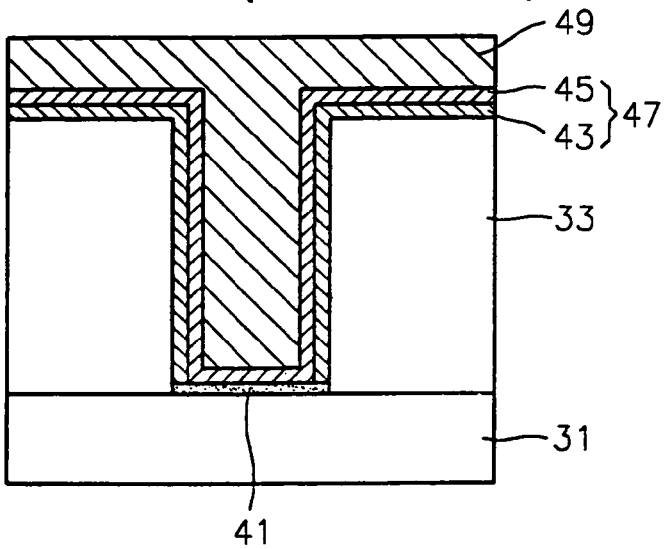

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

Figure 3A:
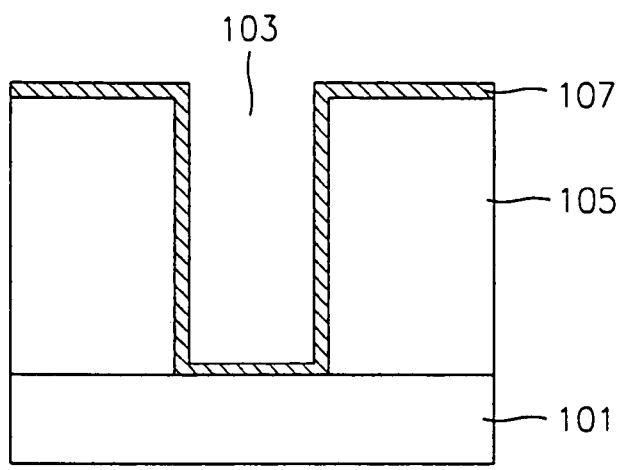
FIGS. 3A through 3D are sectional views that illustrate methods for forming a metal contact in a semiconductor device according to some embodiments of the present invention.

FIGS. 3A through 3D are sectional views that illustrate methods for forming a metal contact in a semiconductor device according to some embodiments of the present invention. Referring now to FIG. 3A, an insulating layer 105 having a contact hole 103 therein is formed on a silicon substrate 101. A cobalt layer 107, which may function as an ohmic layer, is formed on the inner walls and the bottom of the contact hole 103 and on the insulating layer 105. The cobalt layer 107 maybe formed to a thickness of about 5 to 200 Å. The cobalt layer 107 may be formed using PVD or CVD (hereafter, CVD is referred to as including an atomic layer deposition (ALD) method). When the cobalt layer 107 is formed using PVD, the cobalt layer 107 is deposited at a temperature of about 25 to 500° C. In particular embodiments, the cobalt layer 107 is deposited at a temperature of about 400 to 500° C. when PVD is used to improve morphology.

Figure 3B:
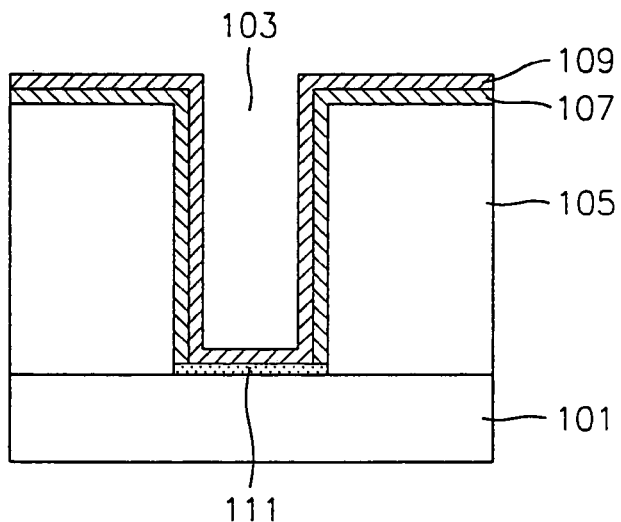

Referring now to FIG. 3B, a titanium layer 109 is formed on the cobalt layer 107 at a temperature of about 400 to 750° C. using CVD. The titanium layer 109 may function as an ohmic layer. The titanium layer 109 is formed on the cobalt layer 107, which has been formed on the inner walls and the bottom of the contact hole 103 and on the insulating layer 105. The titanium layer 109 may be formed to a thickness of about 5 to 150 Å. Because the titanium layer 109 is formed at a relatively high temperature, cobalt silicide 111 is formed on the bottom of the contact hole 103 when forming the titanium layer 109.

Figure 3C:
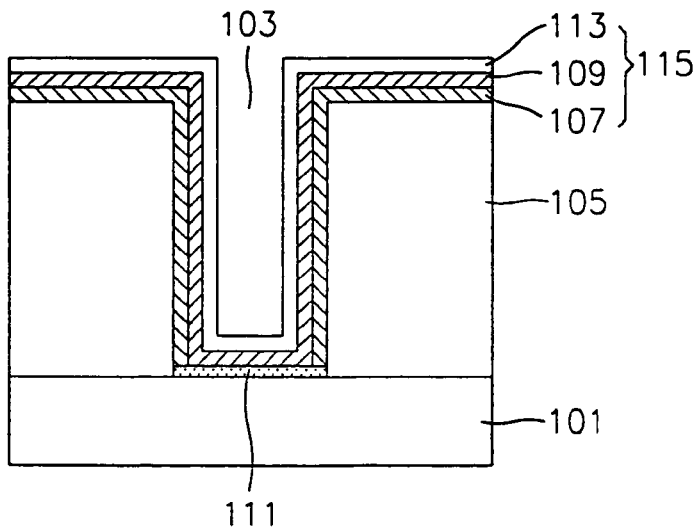

Referring now to FIG. 3C, a titanium nitride layer 113 is formed on the cobalt layer 107 and the titanium layer 109 at a temperature of about 400 to 750° C. using CVD. The titanium nitride layer 113 may be formed to a thickness greater than 50 Å, for example, about 50 to 500 Å. The titanium nitride layer 113 may function as a diffusion barrier layer for preventing the diffusion of a material, which will be formed as a plug, for example, tungsten. As a result, the cobalt layer 107, the titanium layer 109, and the titanium nitride layer 113 may operate as a barrier metal layer 115.

Figure 3D:
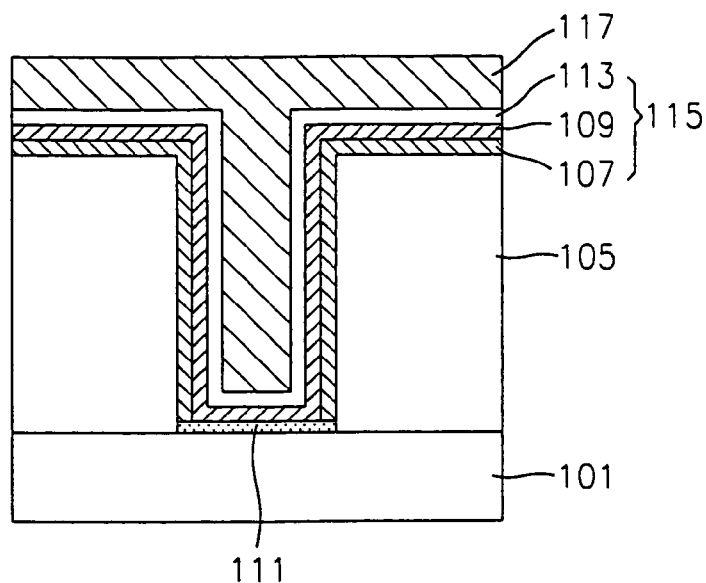

Referring now to FIG. 3D, a plug 117 is formed on the barrier metal layer 115 to fill the contact hole 103 to provide a metal contact. The plug 117 may comprise a tungsten layer, a titanium nitride layer, an aluminum layer, and/or a tantalum nitride layer.

Unlike a conventional method in which two thermal processes and a strip process are performed, the cobalt silicide may function as an ohmic layer by performing relatively simple processing while forming a metal contact in a semiconductor device in accordance with some embodiments of the present invention described above with respect to FIGS. 3A through 3D. In addition, in accordance with some embodiments of the present invention described above with respect to FIGS. 3A through 3D, the cobalt layer and the titanium layer formed on the bottom of the contact hole may function as an ohmic layer. Accordingly, the thickness of the cobalt layer may be reduced compared to that of conventional methods in which only the cobalt layer is used as an ohmic layer. Furthermore, the cobalt silicide is formed when forming the titanium layer at a relatively high temperature, which may allow the thickness of the cobalt layer to be reduced.

Figure 4:
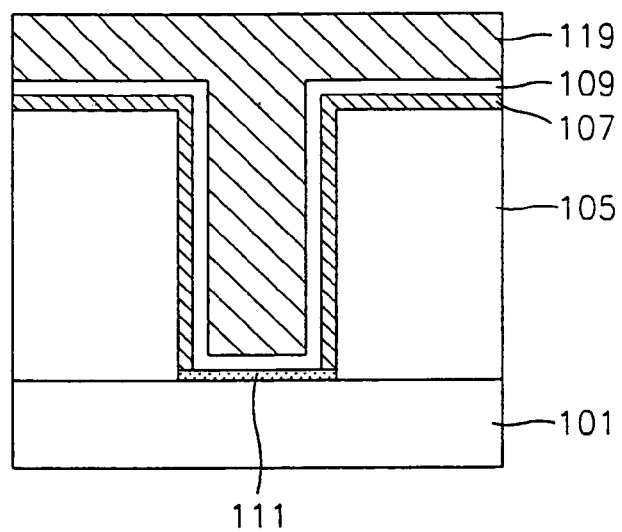
FIG. 4 is a sectional view that illustrates methods for forming a metal contact in a semiconductor device according to additional embodiments of the present invention.

FIG. 4 is a sectional view that illustrates methods for forming a metal contact in a semiconductor device according to additional embodiments of the present invention. The structure and operative effects of the FIG. 4 embodiments of the present invention are similar to those of the embodiments described with respect to FIGS. 3A through 3D. In FIG. 4, however, a plug 119 comprises a titanium nitride layer, which is used as a barrier metal layer. More specifically, a metal contact in a semiconductor device is formed as described above with respect to FIGS. 3A and 3B. Thereafter, referring to FIG. 4, the plug 119 is formed on a titanium layer 109 to fill a contact hole 103 so that a metal contact is completed. The plug 119 may comprise a titanium nitride layer having a thickness of about 20 to 3000 Å.

Figure 5A:
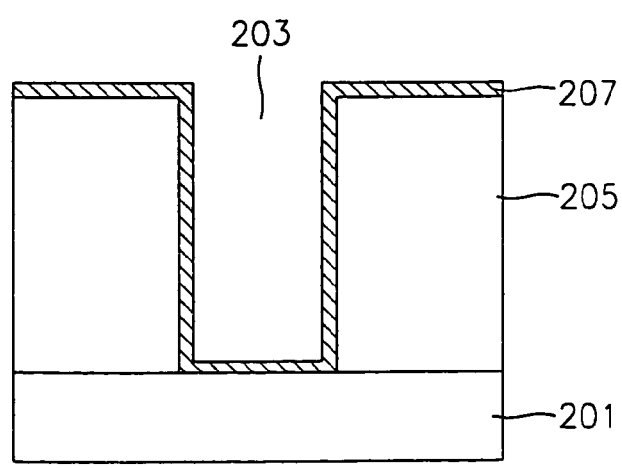
FIGS. 5A through 5C are sectional views that illustrate methods for forming a metal contact in a semiconductor device according to additional embodiments of the present invention.
Figure 5B:
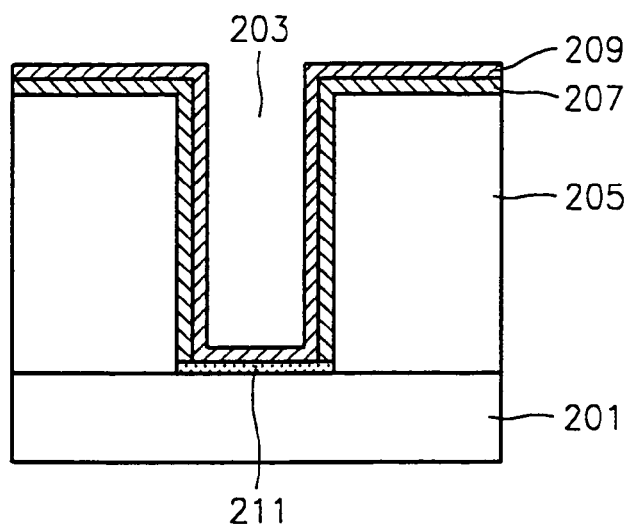
Figure 5C:
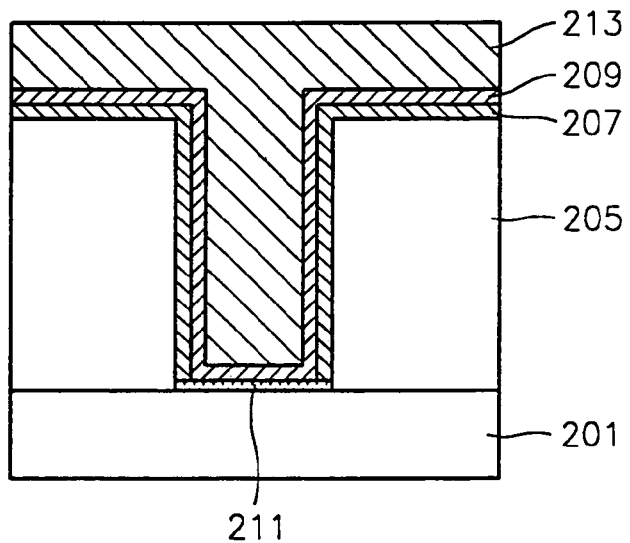

FIGS. 5A through 5C are sectional views that illustrate methods for forming a metal contact in a semiconductor device according to additional embodiments of the present invention. Referring to FIG. 5A, an insulating layer 205 having a contact hole 203 therein is formed on a silicon substrate 201. A cobalt layer 207, which my function as an ohmic layer, is formed on the inner walls and the bottom of the contact hole 203 and on the insulating layer 205. The cobalt layer 207 may be formed to a thickness of about 5 to 200 Å. The cobalt layer 207 may be formed using PVD or CVD including ALD. When the cobalt layer 207 is formed using PVD, the cobalt layer 207 may be deposited at a temperature of about 25 to 500° C. In particular embodiments, the cobalt layer 207 is deposited at a temperature of about 400 to 500° C. when PVD is used to improve morphology.

Referring now to FIG. 5B, a titanium nitride layer 209 is formed on the cobalt layer 207 at a temperature of about 400 to 750° C. using CVD. The titanium nitride layer 209 is formed on the cobalt layer 207, which has been formed on the inner walls and the bottom of the contact hole 203 and on the insulating layer 205. The titanium nitride layer 209 may be formed to a thickness greater than 50 Å, for example, about 50 to 150 Å. The titanium nitride layer 209 may function as a diffusion barrier layer for preventing a material, which will be formed as a plug, for example, tungsten, into a lower silicon layer. Because the titanium nitride layer 209 is formed at a relatively high temperature, cobalt silicide 211 is formed on the bottom of the contact hole 203 when forming the titanium nitride layer 209. Accordingly, the cobalt layer 207 and the titanium nitride layer 209 may operate as a barrier metal layer.

Referring now to FIG. 5C, a plug 213 is formed on the titanium nitride layer 209 as the barrier metal layer to fill the contact hole 203 to provide a metal contact. The plug 213 may comprise a tungsten layer, a titanium nitride layer, an aluminum layer, and/or a tantalum nitride layer.

Unlike a conventional method in which two thermal processes and a strip process are performed, the cobalt silicide may function as an ohmic layer by performing relatively simple processing while forming a metal contact in a semiconductor device in accordance with some embodiments of the present invention described above with respect to FIGS. 5A through 5C.

In addition, in accordance with some embodiments of the present invention described above with respect to FIGS. 5A through 5C, the cobalt silicide is formed when the titanium layer is formed at a relatively high temperature. Accordingly, the thickness of the cobalt layer may be reduced.

Figure 6:
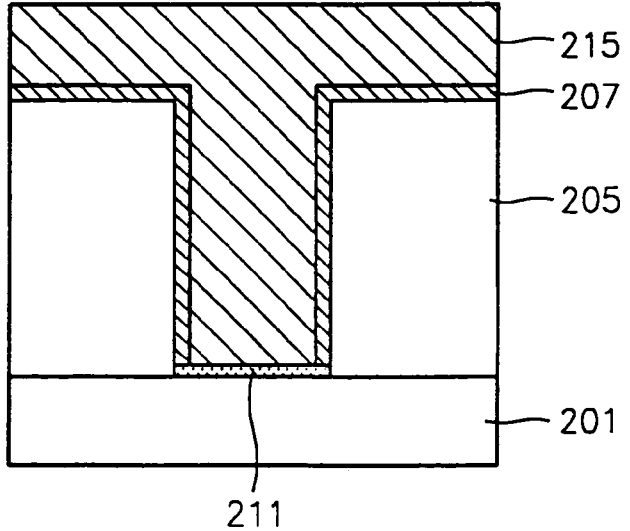
FIG. 6 is a sectional view that illustrates methods for forming a metal contact in a semiconductor device according to additional embodiments of the present invention.

FIG. 6 is a sectional view that illustrates methods for forming a metal contact in a semiconductor device according to additional embodiments of the present invention. The structure and operative effects of the FIG. 6 embodiments of the present invention are similar to those of the embodiments described with respect to FIGS. 5A through 5C. In FIG. 6, however, a plug 215 comprises a titanium nitride layer, which is used as a barrier metal layer. More specifically, a metal contact in a semiconductor device is formed as described above with respect to FIG. 5A. Thereafter, referring now to FIG. 6, the plug 215 is formed on a cobalt layer 217 to fill a contact hole 203. The plug 215 may comprise a titanium nitride layer having a thickness of about 20 to 3000 Å. When forming the plug 215, cobalt silicide 211 is formed on the bottom of the contact hole 203.

Figure 7A:
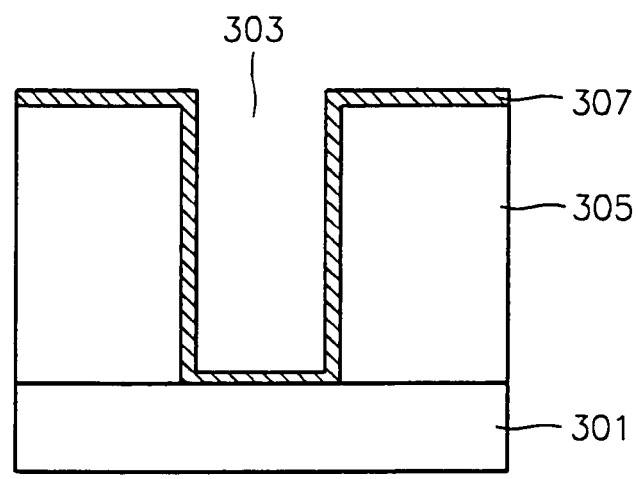
FIGS. 7A through 7D are sectional views that illustrate methods for forming a metal contact in a semiconductor device according to additional embodiments of the present invention.

FIGS. 7A through 7D are sectional views that illustrate methods for forming a metal contact in a semiconductor device according to additional embodiments of the present invention. Referring now to FIG. 7A, an insulating layer 305 having a contact hole 303 therein is formed on a silicon substrate 301. A titanium layer 307, which may function as an ohmic layer, is formed on the inner walls and the bottom of the contact hole 303 and on the insulating layer 305. The titanium layer 307 may have a thickness of about 5 to 150 Å. The titanium layer 307 maybe formed using PVD as shown in FIG. 7A. In other embodiments, the titanium layer 307 may be formed at a temperature of about 400 to 750° C. using CVD. When the titanium layer 307 is formed at a temperature using CVD, titanium silicide is formed on the bottom of the contact hole 303, which is not shown in FIG. 7A.

Figure 7B:
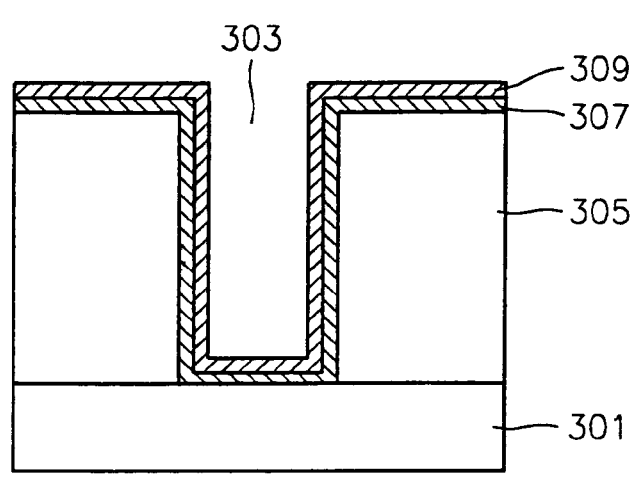

Referring now to FIG. 7B, a cobalt layer 309, which may function as an ohmic layer, is formed on the titanium layer 307. The cobalt layer 309 may have a thickness of about 5 to 200 Å. The cobalt layer 309 may be formed using PVD or CVD including ALD. When the cobalt layer 309 is formed using PVD, the cobalt layer 309 is deposited at a temperature of about 25 to 500° C. In particular embodiments, the cobalt layer 309 is deposited at a temperature of about 400 to 500° C. when PVD is used to improve morphology.

Figure 7C:
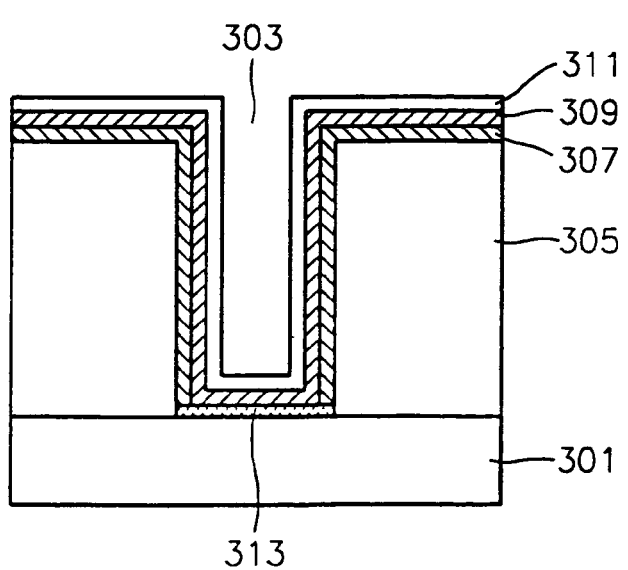

Referring now to FIG. 7C, a titanium nitride layer 311 is formed on the cobalt layer 309 at a temperature of about 400 to 750° C. using CVD. The titanium nitride layer 311 is formed on the cobalt layer 309, which has been formed on the inner walls and the bottom of the contact hole 303 and on the insulating layer 305. The titanium nitride layer 311 may have a thickness greater than 50 Å, for example, about 50 to 500 Å. Because the titanium nitride layer 311 is formed at a relatively high temperature, complex silicide 313 of titanium silicide and cobalt silicide is formed on the bottom of the contact hole 303 when forming the titanium nitride layer 311. The complex silicide 313, the titanium layer 307, and the cobalt layer 309 may function as an ohmic layer. The titanium nitride layer 311 may function as a diffusion barrier layer for preventing the diffusion of a material, which will be formed as a plug, for example, tungsten. As a result, the titanium layer 307, the cobalt layer 309, and the titanium nitride layer 311 may function as a barrier metal layer.

Figure 7D:
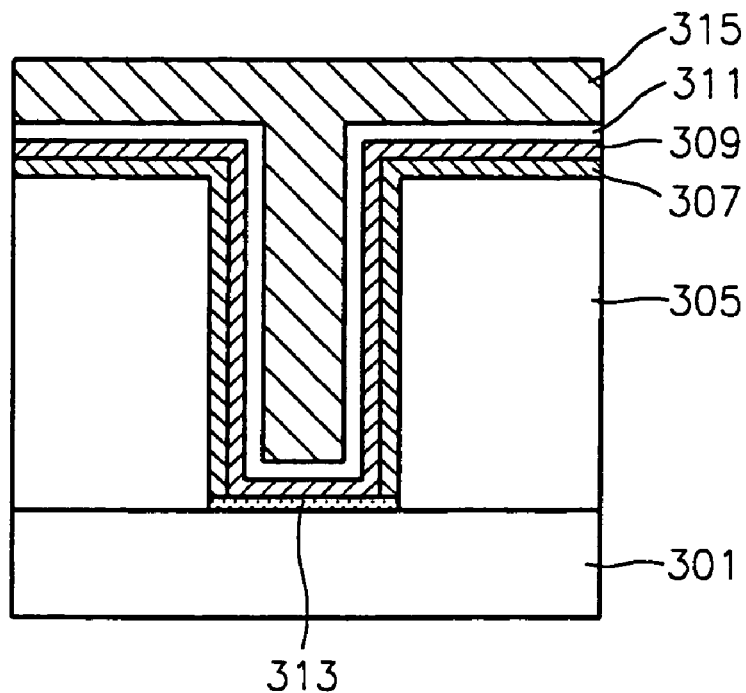

Referring now to FIG. 7D, a plug 315 is formed on the titanium nitride layer 311 to fill the contact hole 303 so that a metal contact is completed. The plug 315 may comprise a tungsten layer, a titanium nitride layer, an aluminum layer, and/or a tantalum nitride layer.

Unlike a conventional method in which two thermal processes and a strip process are performed, the cobalt silicide may function as an ohmic layer by performing relatively simple processing while forming a metal contact in a semiconductor device in accordance with some embodiments of the present invention described above with respect to FIGS. 7A through 7D. In addition, in accordance with some embodiments of the present invention described above with respect to FIGS. 7A through 7D, the cobalt layer and the titanium layer formed on the bottom of the contact hole may function as an ohmic layer. Accordingly, the thickness of the cobalt layer may be reduced compared to that of conventional methods in which only the cobalt layer is used as an ohmic layer. Furthermore, the cobalt silicide is formed when forming the titanium layer at a relatively high temperature, which may allow the thickness of the cobalt layer to be reduced.

Figure 8:
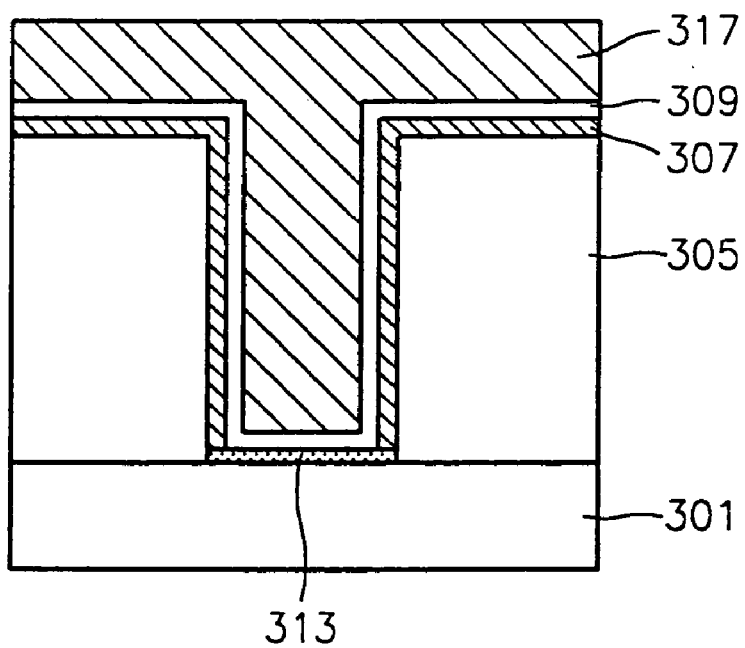
FIG. 8 is a sectional view that illustrates methods for forming a metal contact in a semiconductor device according to additional embodiments of the present invention.

FIG. 8 is a sectional view that illustrates methods for forming a metal contact in a semiconductor device according to additional embodiments of the present invention. The structure and operative effects of the FIG. 8 embodiments of the present invention are similar to those of the embodiments described with respect to FIGS. 7A through 7D. In FIG. 8, however, a plug 317 comprises a titanium nitride layer, which is used as a barrier metal layer. More specifically, a metal contact in a semiconductor device is formed as described above with respect to FIGS. 7A and 7B. Thereafter, referring now to FIG. 8, the plug 317 is formed on a cobalt layer 309 to fill a contact hole 303. The plug 317 may comprise a titanium nitride layer having a thickness of about 20 to 3000 Å. When forming the plug 317, cobalt silicide 313 is formed on the bottom of the contact hole 303.

Figure 9:
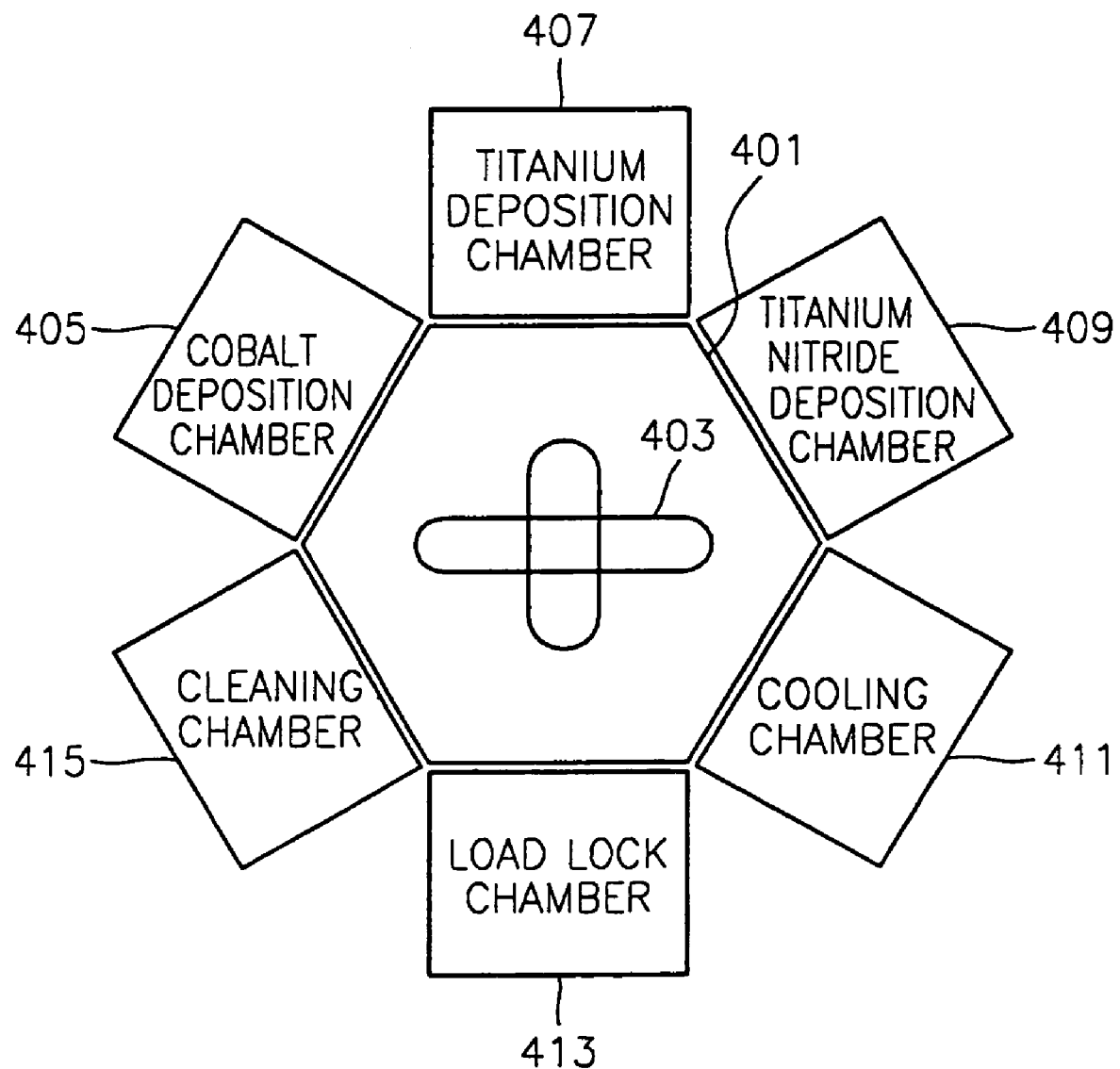
FIG. 9 is a schematic view illustrating manufacturing equipment used for forming a metal contact in a semiconductor device according to some embodiments of the present invention.

FIG. 9 is a schematic view illustrating manufacturing equipment used for forming a metal contact in a semiconductor device in accordance with some embodiments of the present invention. More specifically, the equipment according to embodiments of the present invention comprises a plurality of chambers installed on a body 401 and a transfer module 403, which is located in the body 401 for transferring wafers to each chamber. The chambers installed on the body 401 include a cobalt deposition chamber 405, a titanium deposition chamber 407, a titanium nitride deposition chamber 409, a cooling chamber 411, a load lock chamber 413, and a cleaning chamber 415. A wafer loaded in the load lock chamber 413 having an insulating layer with a contact hole formed therein formed thereon is cleaned in the cleaning chamber 415 and layers are formed on the wafer as it passes through each of the chambers 405, 407, and 409. Thereafter, the wafer including the layers is cooled in the cooling chamber 411. The cooled wafer is then discharged to the outside via the load lock chamber 413.

According to some embodiments of the present invention, when a metal contact in a semiconductor device is formed using the above-described equipment, the depositions of the cobalt layer, the titanium layer, and the titanium nitride layer, the depositions of the cobalt layer and the titanium nitride layer, and/or the depositions of the titanium layer, the cobalt layer, and the titanium nitride layer can be performed on the wafer in situ after the wafer is cleaned without a vacuum break.

If the cobalt layer is deposited in cobalt layer deposition equipment and a titanium layer and a titanium nitride layer are deposited in the other equipment after a vacuum break as in a conventional method, $CoO_x$ may be generated on the cobalt layer so that the generation of an ohmic layer is interrupted and a resistance is increased. Accordingly, a cleaning process may be required after the deposition of the cobalt layer. When the equipment of FIG. 9 is used, however, the wafers are cleaned and the cobalt layer, the titanium layer, and the titanium nitride layer are deposited in situ without a vacuum break so that the number and the time of processes are reduced while attaining a relatively stable contact resistance.

Figure 10:
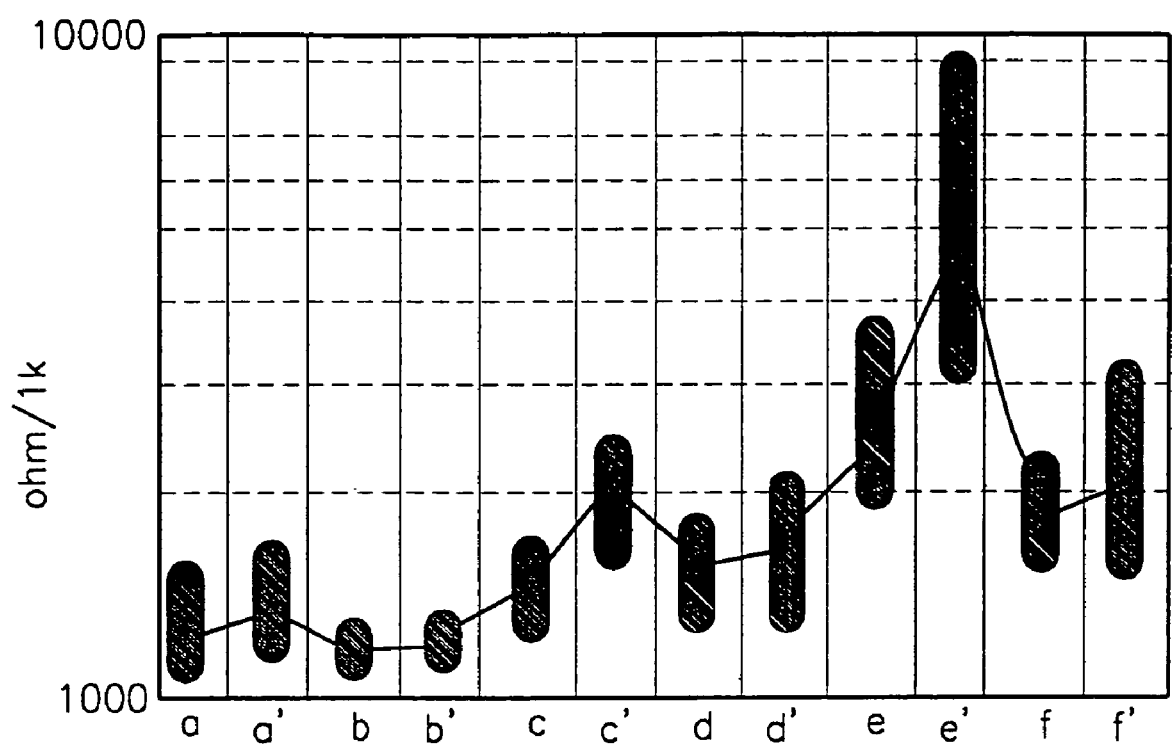
FIG. 10 is a graph that illustrates contact resistances when metal contacts are formed in semiconductor devices according to conventional methods and methods according to various embodiments of the present invention.

FIG. 10 is a graph that illustrates contact resistances when metal contacts are formed in semiconductor devices according to conventional methods and methods according to various embodiments of the present invention. The horizontal axis denotes experimental conditions and the vertical axis denotes the contact resistance distribution of 1000 contacts. More specifically, reference numerals a and a' denote contact resistances when a cobalt layer is formed to a thickness of 100 Å, a titanium layer is formed to a thickness of 75 Å using CVD, and a titanium nitride layer is formed to a thickness of 250 Å using CVD according to the embodiments of FIGS. 3A through 3D. Reference numerals b and b' denote contact resistances when the cobalt layer is formed to a thickness of 200 Å, the titanium layer is formed to a thickness of 75 Å using CVD, and the titanium nitride layer is formed to a thickness of 250 Å using CVD according to the embodiments of FIGS. 3A through 3D. Reference numerals c and c' denote contact resistances when the cobalt layer is formed to a thickness of 100 Å according to the embodiments of FIGS. 7A through 7D. Reference numerals d and d' denote contact resistances of conventionally formed cobalt silicide. Reference numerals e, e', f, and f' denote contact resistances of conventionally formed titanium silicide. In addition, reference numerals a, b, c, d, e, and f are the contact resistances when the layers are annealed at a temperature of 750° C. for 30 minutes. Reference numerals a', b', c', d', e', and f' are the contact resistances when the layers are annealed at a temperature of 750° C. for 30 minutes twice.

As shown in FIG. 10, the contact resistance of a semiconductor device, according to embodiments of the present invention, is generally less than the contact resistances of conventionally formed titanium silicide and cobalt silicide. In addition, even when the thermal processes are performed twice, the contact resistance of the semiconductor device according to embodiments of the present invention is generally less than the contact resistances of conventionally formed titanium silicide and cobalt silicide.

Figure 11A:
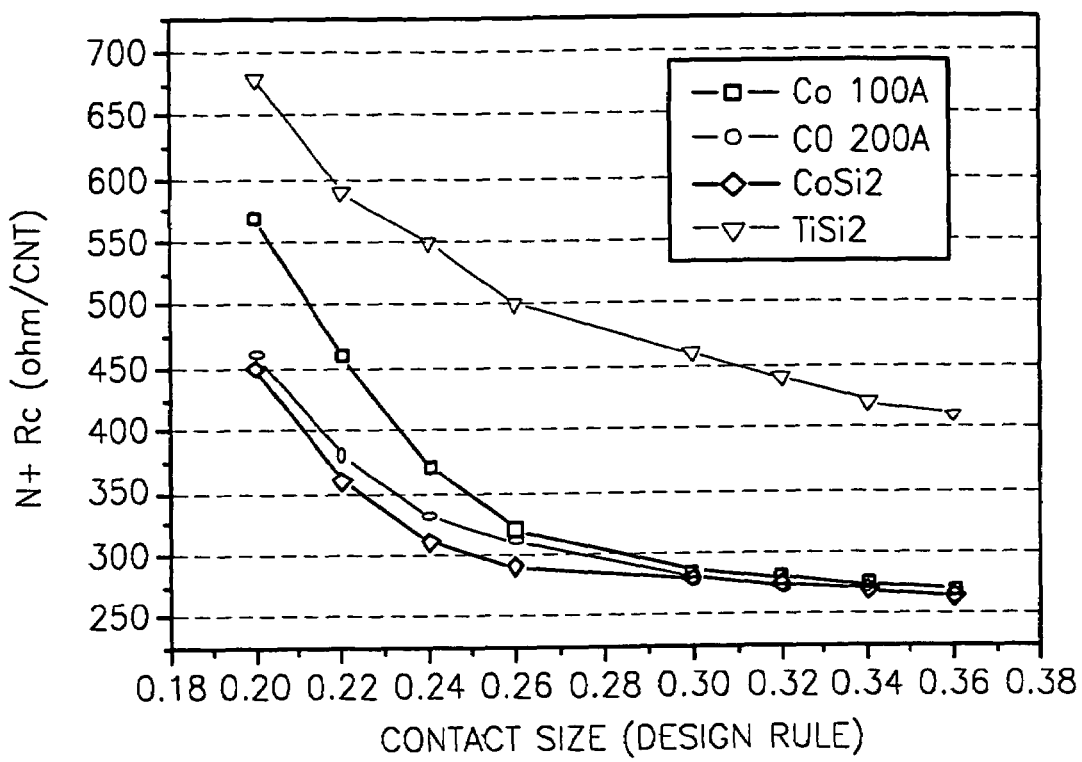
FIGS. 11A and 11B are graphs illustrating contact resistances of $N^+$ contacts and $P^+$ contacts versus contact size when a bit line contact is formed in prior art semiconductor devices and semiconductor devices according to embodiments of the present invention.
Figure 11B:
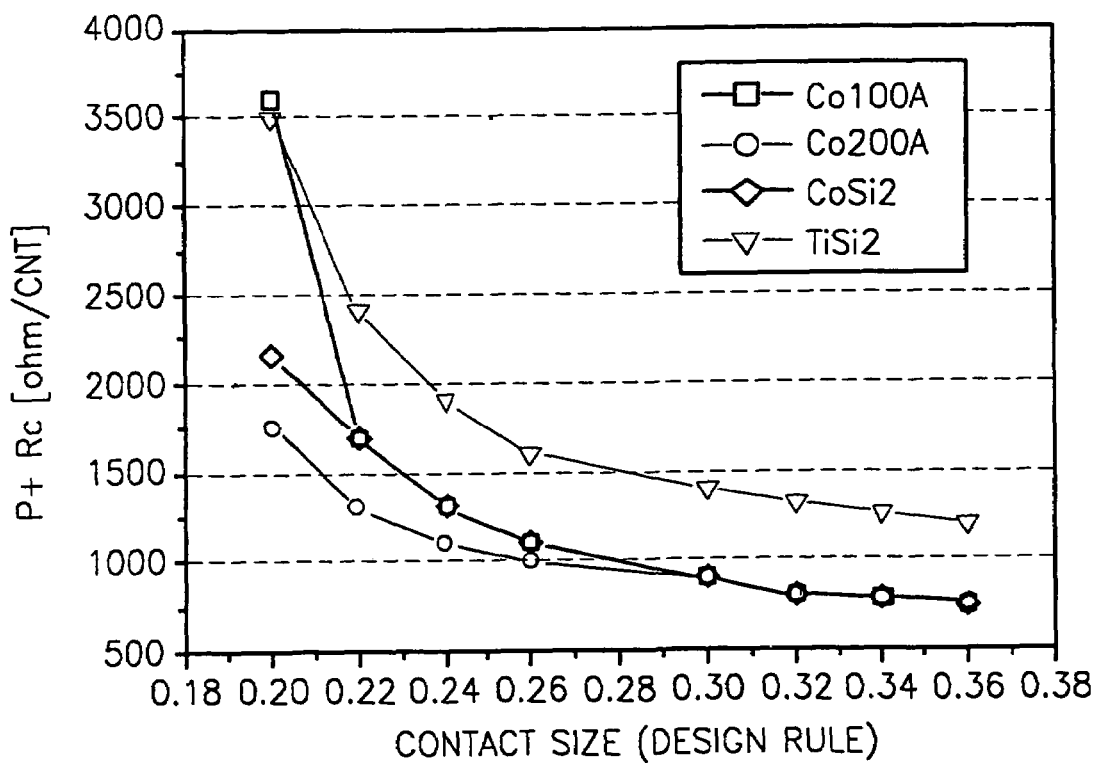

FIGS. 11A and 11B are graphs illustrating contact resistances of $N^+$ contacts and $P^+$ contacts versus contact size when a bit line contact is formed in prior art semiconductor devices and semiconductor devices according to embodiments of the present invention. More specifically, in FIGS. 11A and 11B, Co 100A, denoted by transparent rectangles, and Co 200A, denoted by transparent circles, are formed by the conditions denoted by reference characters a and b of FIG. 10. In other words, Co 100A and Co 200A denote the cases where metal contacts are formed according to embodiments of the present invention. $CiSi_2$, denoted by transparent diamonds, is formed by the conditions denoted by reference character d of FIG. 10. In other words, $CiSi_2$ denotes the case where a contact is formed by conventional cobalt silicide. $TiSi_2$, denoted by transparent inverse triangles, is formed by the conditions denoted by reference characters e or f of FIG. 10. In other words, $TiSi_2$ denotes the case where a contact is formed using conventionally formed titanium silicide.

As shown in FIGS. 11A and 11B, the contact resistance of the bit line contact, which is formed according to embodiments of the present invention, is less than the contact resistance of the conventional bit line contact where cobalt silicide or titanium silicide is used. In particular, the effect is more significant when the contact size is reduced.

Unlike a conventional method in which two thermal processes and a strip process are performed, the cobalt silicide may function as an ohmic layer by performing relatively simple processing while forming a metal contact in a semiconductor device in accordance with some embodiments of the present invention. In addition, in accordance with some embodiments of the present invention, the cobalt layer and the titanium layer formed on the bottom of the contact hole may function as an ohmic layer. Accordingly, the thickness of the cobalt layer may be reduced compared to that of conventional methods in which only the cobalt layer is used as an ohmic layer. Furthermore, the cobalt silicide is formed when forming the titanium layer at a relatively high temperature, which may allow the thickness of the cobalt layer to be reduced.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A method of forming a metal contact in a semiconductor device, comprising:
    forming an insulating layer having a contact hole therein on a silicon substrate;
    forming a cobalt layer on a bottom and inner walls of the contact hole;
    forming a cobalt silicide layer at the bottom of the contact hole while forming a titanium layer on the cobalt layer; and
    forming a plug on the titanium layer so as to fill the contact hole.

2. The method of claim 1, wherein the plug comprises titanium nitride.

3. The method of claim 1, further comprising:
    forming a titanium nitride layer on the titanium layer; and
    wherein forming the plug comprises:
    forming the plug on the titanium nitride layer so as to fill the contact hole.

4. The method of claim 3, wherein the titanium nitride layer has a thickness of about 50 to 500 Å.

5. The method of claim 4, wherein the titanium nitride layer is formed using chemical vapor deposition (CVD) at a temperature of about 400 to 750° C.

6. The method of claim 3, wherein the plug comprises at least one of tungsten, titanium nitride, aluminum, and tantalum nitride.

7. The method of claim 3, wherein the cobalt layer, the titanium layer, and the titanium nitride layer are formed in situ without a vacuum break.

8. The method of claim 1, wherein the cobalt layer has a thickness of about 5 to 200 Å.

9. The method of claim 1, wherein the cobalt layer is formed using one of physical vapor deposition (PVD) and chemical vapor deposition (CVD).

10. The method of claim 9, wherein the cobalt layer is formed using PVD at a temperature of about 25 to 500° C.

11. The method of claim 1, wherein the titanium layer has a thickness of about 5 to 150 Å.

12. The method of claim 1, wherein the titanium layer is formed using chemical vapor deposition (CVD) at a temperature of about 400 to 750° C.

13. The method of claim 1, wherein substrate and insulating layer are cleaned after forming the insulating layer.

14. A method of forming a metal contact in a semiconductor device, comprising:
    forming an insulating layer having a contact hole therein on a silicon substrate;
    forming a cobalt layer as an ohmic layer on a bottom and inner walls of the contact hole;
    forming a cobalt silicide layer at the bottom of the contact hole while forming a titanium layer as an ohmic layer on the cobalt layer; and
    forming a plug on the titanium layer so as to fill the contact hole;
    wherein the cobalt layer and titanium layer are a dual ohmic layer, and the titanium layer is formed at a temperature of about 400 to 750° C.

* * * * *